US008787025B2

(12) United States Patent
Wu

(10) Patent No.: US 8,787,025 B2
(45) Date of Patent: Jul. 22, 2014

(54) ELECTRONIC MODULE WITH IMPROVED LATCH MECHANISM

(75) Inventor: Jerry Wu, Irvine, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 199 days.

(21) Appl. No.: 13/405,599

(22) Filed: Feb. 27, 2012

(65) Prior Publication Data

US 2012/0218720 A1 Aug. 30, 2012

(30) Foreign Application Priority Data

Feb. 25, 2011 (CN) .......................... 2011 1 0046801

(51) Int. Cl.
*H05K 1/14* (2006.01)

(52) U.S. Cl.
USPC ............................ 361/740; 361/755; 361/802

(58) Field of Classification Search
USPC ................. 361/736, 740, 747, 755, 801, 802; 439/352, 353, 354, 357
See application file for complete search history.

(56) References Cited

U.S. PATENT DOCUMENTS

| | | | | |
|---|---|---|---|---|
| 6,430,053 | B1 * | 8/2002 | Peterson et al. | 361/728 |
| 6,749,448 | B2 | 6/2004 | Bright et al. | |
| 6,758,699 | B1 * | 7/2004 | Hwang et al. | 439/676 |
| 6,776,646 | B2 * | 8/2004 | Lee | 439/357 |
| 6,824,416 | B2 | 11/2004 | Di Mascio | |
| 6,851,867 | B2 | 2/2005 | Pang et al. | |
| 6,884,097 | B2 | 4/2005 | Ice | |
| 6,908,323 | B2 | 6/2005 | Ice | |
| 7,052,306 | B2 | 5/2006 | Ishigami et al. | |
| 7,090,523 | B2 | 8/2006 | Shirk et al. | |
| 7,309,250 | B2 | 12/2007 | Reed et al. | |
| 7,540,755 | B1 * | 6/2009 | Wu | 439/352 |
| 7,736,171 | B2 | 6/2010 | Reed et al. | |
| 7,771,225 | B1 * | 8/2010 | Wu | 439/352 |
| 8,562,373 | B2 * | 10/2013 | Wu | 439/352 |
| 8,585,426 | B2 * | 11/2013 | Zerebilov et al. | 439/370 |
| 8,597,045 | B2 * | 12/2013 | Zhu et al. | 439/357 |

* cited by examiner

*Primary Examiner* — Hung S Bui
(74) *Attorney, Agent, or Firm* — Ming Chieh Chang; Wei Te Chung

(57) ABSTRACT

An electronic module for mating with a complementary connector, comprises: a housing, a printed circuit board disposed in the housing, a slider member movably received in the channel, a cover member confining the slider member to the housing, a gasket mounted to the housing and having a pair of engaging portions, and an ejector located above on the slider member. The slider member has a body portion and a pair of arm portions extending forwardly from the body portion. The ejector is located above the pair of arm portions, and has a pair of cantilever portions pivotable outward, in response to a sliding movement of the slider member, against the pair of engaging portions.

20 Claims, 8 Drawing Sheets

ELECTRONIC MODULE WITH IMPROVED LATCH MECHANISM

CROSS-REFERENCE TO RELATED APPLICATION

This application is related to U.S. patent application Ser. No. 13/405,591 filed on Feb. 27, 2012, and entitled "ELECTRONIC MODULE WITH IMPROVED LATCH MECHANISM," which has the same applicant and assignee as the present invention. The disclosure of the related application is incorporated herein by reference.

BACKGROUND OF THE INVENTION

1. Field of the Invention

The present invention generally relates to an electronic module, and more particularly to an electronic module having an improved latch mechanism for high speed signal transmission.

2. Description of Related Art

SFP (Small Form-factor Pluggable), X-SFP and QSFP are all modules for fiber optic transmission or copper-based signal transmission. It is important for the modules to be of small size or form factor. The smaller the form factor of the module, the less space taken on a printed circuit board to which it couples. A smaller form factor allows a greater number of modules to be coupled onto a printed circuit board to support additional communication channels. However, the smaller form factor makes it more difficult for a user to handle. When such a module embedded in a system fails, it need be replaced. To replace a failed module, it needs to be pluggable into a module receptacle surrounding a host board connector.

U.S. Pat. No. 7,309,250 discloses a module received in a corresponding cage or receptacle and comprising a housing, a circuit card, and a de-latching assembly at least partially disposed within the housing. The latching assembly has a rear handle portion and two arms that extend forwardly from the handle portion through the housing, the arms are terminating in free ends, and each of the free ends includes a cam portion that is aligned to selectively contact a corresponding engagement tab disposed on an opposing shielded housing to move the engagement tab out of engagement with the plug connector housing so that the plug connector may be disengaged and easily removed from the shielded housing. U.S. Pat. No. 7,736,171 discloses a module comprising a housing, an actuator moveable relative to the housing in a horizontal direction, and a latch member discrete from and operable by the actuator. The latch member comprises an engaging portion assembled to said housing, an actuation section positioned forwardly from the engaging portion and actuated by a cooperating portion of the actuator, and a front latch portion.

An electronic module having an improved latch mechanism is desired.

SUMMARY OF THE INVENTION

Accordingly, an object of the present invention is to provide an electronic module having an improved latch mechanism to be separated from a complementary connector expediently.

In order to achieve the object set forth, an electronic module for mating with a complementary connector, comprises: a housing, a printed circuit board disposed in the housing, a slider member movably received in the channel, a cover member confining the slider member to the housing, a gasket mounted to the housing and having a pair of engaging portions, and an ejector located above on the slider member. The slider member has a body portion and a pair of curved arm portions extending forwardly from the body portion. The ejector is located above the pair of arm portions, and has a pair of cantilever portions pivotable outward, in response to a sliding movement of the slider member, against the pair of engaging portions.

Other objects, advantages and novel features of the invention will become more apparent from the following detailed description when taken in conjunction with the accompanying drawings.

DETAILED DESCRIPTION OF THE INVENTION

Figure 1:
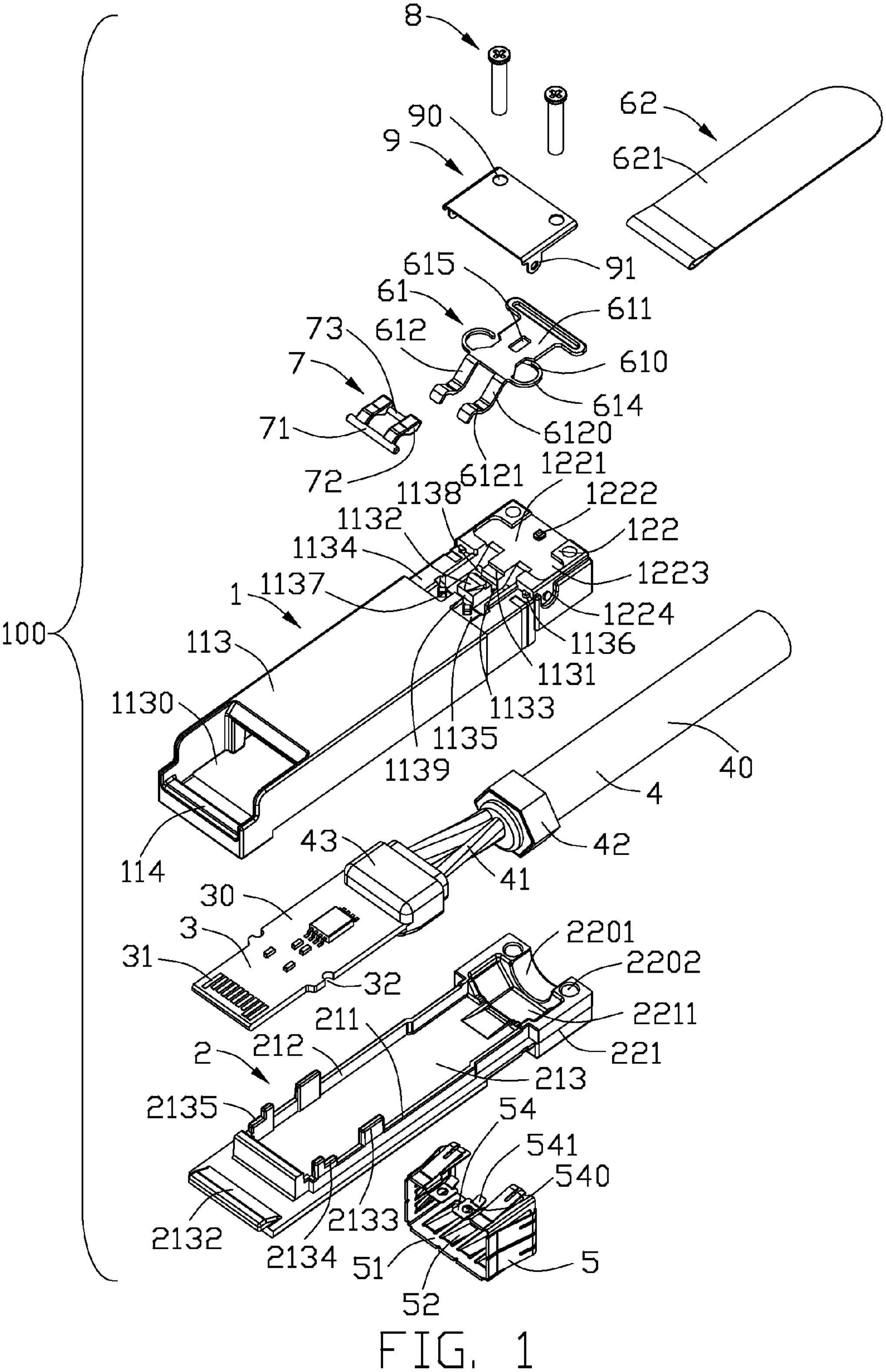
FIG. 1 is an exploded, perspective view of an electronic module in accordance with the present invention.

Reference will now be made in detail to the preferred embodiment of the present invention, taking a copper based module as an example. It is noted that the present invention generally finds its application in other types of modules like opto-electronic modules, transceivers, etc., either connectorized for receiving optical connectors or permanently integrated with fiber cables, which substantially includes an outer housing or frame. Therefore, the term "electronic module" is intended to include opto-electronic modules or transceivers.

Referring to FIGS. 1-4, the electronic module 100 comprises a housing (not numbered) formed by a conductive base portion 1 and a conductive panel portion 2, a printed circuit board 3, a cable 4, a metallic gasket 5 and a latch mechanism (not numbered).

Figure 2:
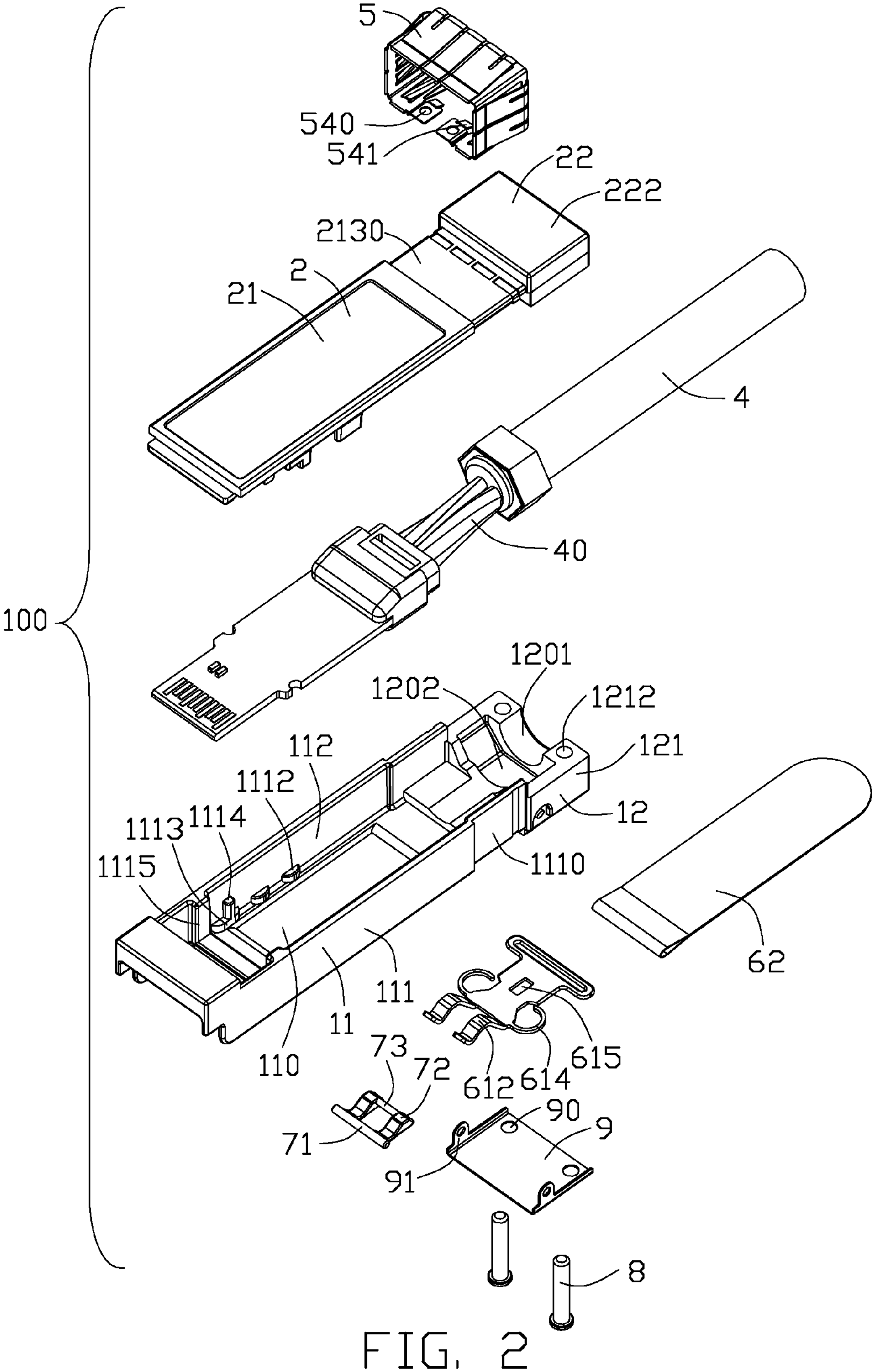
FIGS. 2-3 are other views similar to FIG. 1, but viewed from different aspects.

Referring to FIGS. 1-2, the base portion 1 is die-cast or other metallic plated body, and includes a primary body portion 11 and a first mounting portion 12 rearward extending from a back face of the primary body portion 11.

The primary body portion 11 has a pair of lateral walls 111, 112 and a top wall 113 connecting with the lateral walls 111, 112 to form a receiving space 110 with an opening (not numbered) facing downward. Rear sections of the pair of the lateral walls 111, 112 define a pair of first depression portions 1110. An outlet 1130 is formed on a front section of the top wall 113. A rear section of the top wall 113 defines a first channel 1131 located in a middle area thereof. And, a locking piece 1132 is formed in the front and middle of the first channel 1131. A slit 1133 is recessed from an upper wall of the first channel 1131 and located behind the locking piece 1132. A pair of sunken portions 1134 are formed on two lateral areas of the rear section of the top wall 113, and respectively arranged at two outer sides of the first channel 1131. A pair of indentations 1135 are respectively located at inner side of the corresponding sunken portions 1134 and formed in front of the first channel 1131. And each of the indentation 1135 is deeper than each of the sunken portion 1134. A pair of protrusions 1136 are respectively formed in a rear end of the two sunken portions 1134. A pair of tiny posts 1137 are respectively formed in the pair of indentations 1135. A pair of recesses 1138 are formed on two sides of the first channel 1131, the two recesses 1138 are also respectively located at two inner sides of the two sunken portions 1134 and located behind the two indentations 1135. And, the recess 1138 is deeper than the indentation 1135. A notch 1139 is disposed on the upper wall of the first channel 1131 and in front of the locking piece 1132.

The primary body portion 11 further has a beam portion 114 with substantially L-shaped cross-section interconnecting two front ends of the pair of the lateral walls 111, 112. The lateral walls 111, 112 of the primary body portion 11 respectively has two first standoffs 1112 and a second standoff 1113 located in front of the two first standoffs 1112 on an inner surface thereof. The two first standoffs 1112 and the second standoff 1113 are located adjacent to the outlet 1130 of the primary body portion 11. And a pair of wider ribs 1115 are respectively formed on two inner surfaces of the lateral walls 111, 112 and disposed in front of each second standoff 1113. Each second standoff 1113 has a situating post 1114 formed thereon. The situating post 1114 formed on the lateral wall 111 and the situating post 1114 formed on the lateral wall 112 are staggered with each other along a longitudinal direction.

The first mounting portion 12 has a pair of side walls 121 and a top wall 122. The first mounting portion 12 defines a first semi-circular cavity 1201 and a first position slot 1202 located in front of the first semi-circular cavity 1201. The first position slot 1202 is deeper than the first semi-circular 1201. A mounting channel 1221 is formed on a middle area of the top wall 122 and communicated with the first channel 1131 of the primary body portion 11. A projection 1222 is formed in the mounting channel 1221 and located behind the locking piece 1132. A pair of fixing passages 1223 are formed on two lateral sides of the mounting channel 1221. And the first mounting portion 12 defines a pair of screw holes 1212 throughout the first mounting portion 12 along a vertical direction and respectively formed at two rear corners thereof. A pair of semi-circular holes 1224 are respectively formed on exterior surfaces of the pair of side walls 121.

The panel portion 2 is die-cast or a metallic plated body. The panel portion 2 comprises a secondary body portion 21 and a second mounting portion 22 extending rearwards from a back face of the secondary body portion 21. The secondary body portion 21 has a planar board member 213 and a pair of flange members 211, 212 formed on two lateral sides thereof. The board member 213 defines a second depression portion 2130 formed on an outer surface thereof and a vertical wall 2131 perpendicular to the pair of flange members 211, 212 and interconnected with two front ends of the pair of flange members 211, 212. The two flange members 211, 212 respectively defines two supporting posts 2133 extending upward from thereon. Four supporting posts 2133 are located behind the vertical wall 2131. A front supporting post 2133 of the two supporting posts 2133 on the flange member 211 has a first aperture 2134 opening facing rearwardly. And a front supporting post 2133 of the two supporting posts 2133 on the flange member 212 has a second aperture 2135 opening facing forwardly. That is to say, the first aperture 2134 and the second aperture 2135 have opposite facing directions with each other. The board member 213 has a protrusion portion 2132 on a front end thereof.

The second mounting portion 22 also has a pair of side walls 221 and a bottom wall 22. The second mounting portion 22 defines a second semi-circular cavity 2201 and a second position slot 2202 located in front of the second semi-circular cavity 2201. And the second mounting portion 12 defines a pair of through holes 2211 throughout the second mounting portion 12 along a vertical direction and respectively formed on two rear corners thereof.

The printed circuit board 3 includes a substrate 30, a plurality of first conductive pads 31 formed on two opposite surfaces of a front section of the substrate 30 and a plurality of second conductive pads (not shown) located on a rear section thereof. A pair of semi-circular positioning holes 32 are formed at two sides of a front segment of the substrate 30. The shape of the positioning hole 32 also can be defined by other configurations, such as square.

The cable 4 includes an outer insulative jacket 40 and a number of wires 41 enclosed by the insulative jacket 40. And a number of wires 41 are insulated with each other. A cable holder member 42 is attached to the cable 4 and surrounds a front portion of the cable 4. The cable holder member 42 is adjacent to the exposed wires 41. A front section of the wires 41 are electrically connected with the second conductive pads of the printed circuit board 3. And, an insulator 43 is formed around a connection between a front section of the wires 41 and a rear end of the printed circuit board 3.

The gasket 5 is made of metal sheet and has a rectangular frame portion 51. The frame portion 51 defines a pair of vertical sides 5*a*, 5*b*, a lower side 5*c* connecting with the pair of vertical sides 5*a*, 5*b*, and a pair of upper walls 5*d* respectively extending inwardly from two top ends of the pair of vertical walls 5*a*, 5*b*. An outlet 50 is formed between the pair of upper walls 5*d* for the gasket 5 easily assembling to the housing. A number of fingers 52, 53 formed on the frame portion 51 are divided into a layer of first fingers 53 and a layer of second fingers 52. A number of first fingers 53 are located on an outer side of the frame portion 51. A number of second fingers 52 are located on an inner side of the frame portion 51. A number of second fingers 52 are shielded by a number of first fingers 53 to achieve better Electro-Magnetic Interference (EMI) suppressing effect. A number of first fingers 53 extend rearward and outward from front edge of the frame portion 51. And a number of second fingers 52 are stamped from the frame portion 51 and extend rearward and outward. Each upper wall 5*d* defines an engaging portion 54 with a circular hole 540 in the middle thereof, and the circular holes 540 are cooperated with the tiny posts 1137, each engaging portion 54 has a tip end 541 extending rearwards. Each upper wall 5*d* further defines a semi-circular hole 55 cooperated with the protrusion 1136.

The latch mechanism includes a slider member 61 and a pull tape 62 connected with each other. The slider member 61 is formed of metallic material and has a body portion 611 received in the mounting channel 1221, and two arm portions 612 extending forwardly from a front face of the body portion 611. The two arm portions 612 are spaced apart with each other along a transversal direction. The arm portions 612 are accommodated in the corresponding recesses 1138. Each arm portion 612 comprises a first slanted portion 6120 extending forwards from the front face of the body portion 611, and a second slanted portion 6121 extending forwardly from the first slanted portion 6120. A pair of cutouts 613 are formed on both sides of the body portion 611, a pair of elastic portions 614 are defined on both sides of the body portion 611 and outside the corresponding cutouts 613. A groove 615 is disposed in the middle of the body portion 611 and behind the elastic portions 614, and the projection 1222 of the base portion 1 is received into the groove 615 when the slider member 61 is assembled to the base portion 1.

The pull tape 62 is a soft belt with a certain width. The pull tape 62 defines a connecting end attached to a rear end of the slider member 61 and a handling portion 621 for an operator pulling the latch mechanism.

An ejector 7 is a metallic member, and has a pair of cantilever portions 70 spaced apart from each other along a transverse direction and located above the second slanted portions 6121, and the cantilever portions 70 extend along a front-to-back direction. A pivot or first transverse bar 71 is connected with two front ends of the cantilever portions 70, and received in the notch 1139 of the base portion 1. Each cantilever portion 70 has a tuber 72 extruding downwards from a back end thereof, and the tubers 72 are abutting against the corresponding second slanted portions 6121, the tubers 72 will move beyond the top wall 113 of the base portion 1 as actuating the slider member 61. A second transverse bar 73 is formed between the two tubers 72 and received in the slit 1133, and the first bar 71 has a larger length than the second bar 73.

A metallic cover member 9 is made of metal sheet and located above the slider member 61, the cover member 9 is shielding on the body portion 611. A pair of openings 90 are defined on two sides of a rear segment of the cover member 9. A pair of connecting portions 91 are defined on lateral sides of a front section of the cover member 9 for cooperating with a pair of semi-circular holes 1224 of the base portion 1 and engaged with two positioning posts (not labeled).

Figure 5:
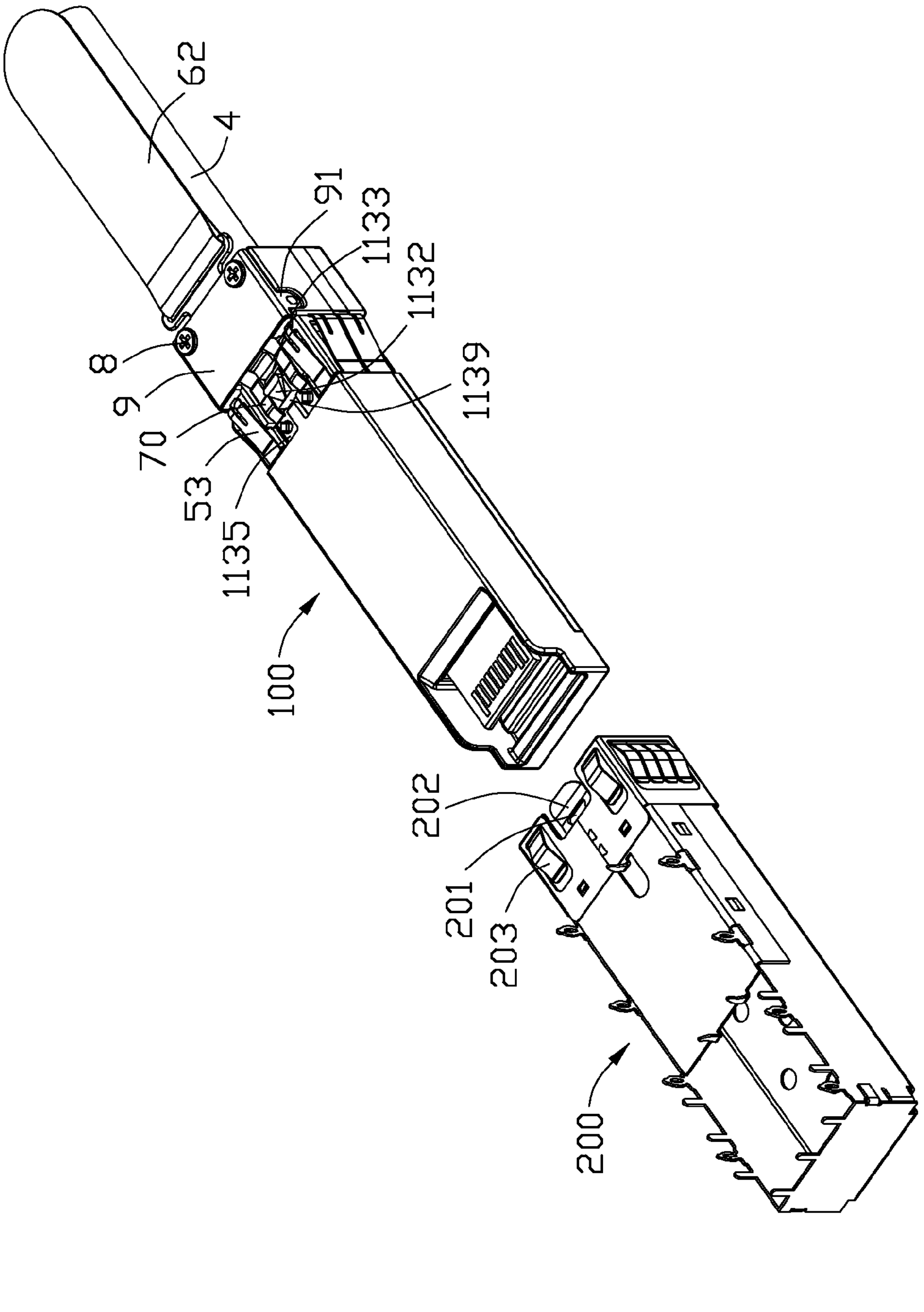
FIG. 5 is an exploded, perspective view of an electrical connector assembly formed by the electronic module shown in FIG. 4 and a cage.
Figure 6:
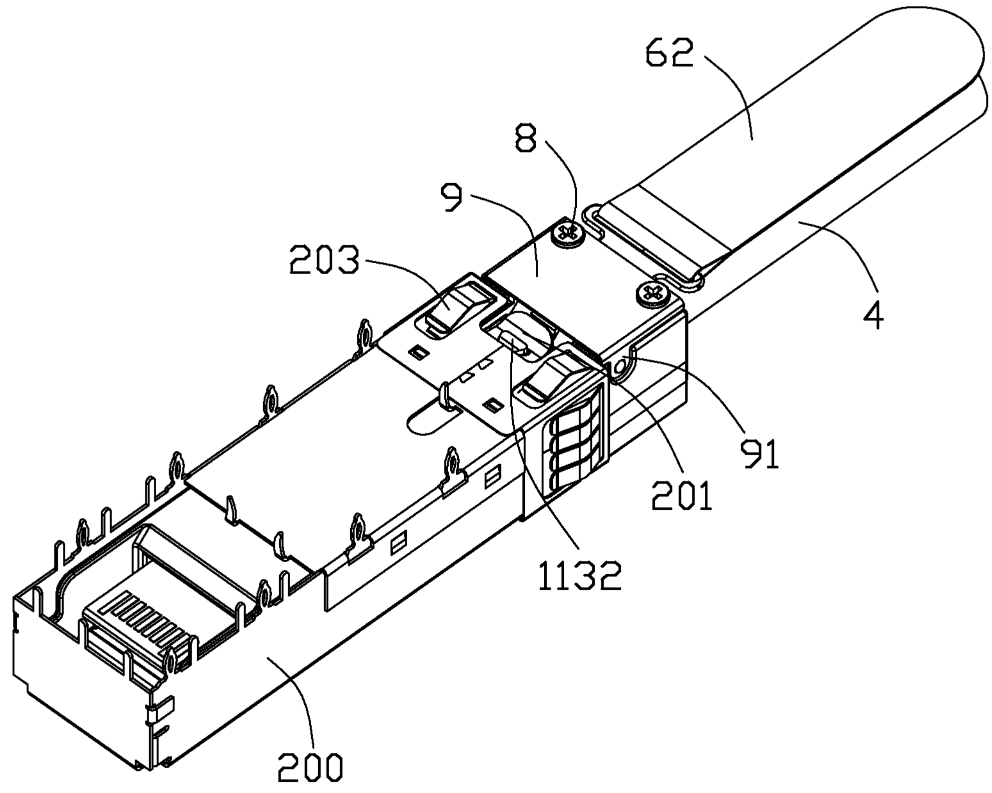
FIG. 6 is an assembled, perspective view of the electrical connector assembly formed by the electronic module and a cage.
Figure 7:
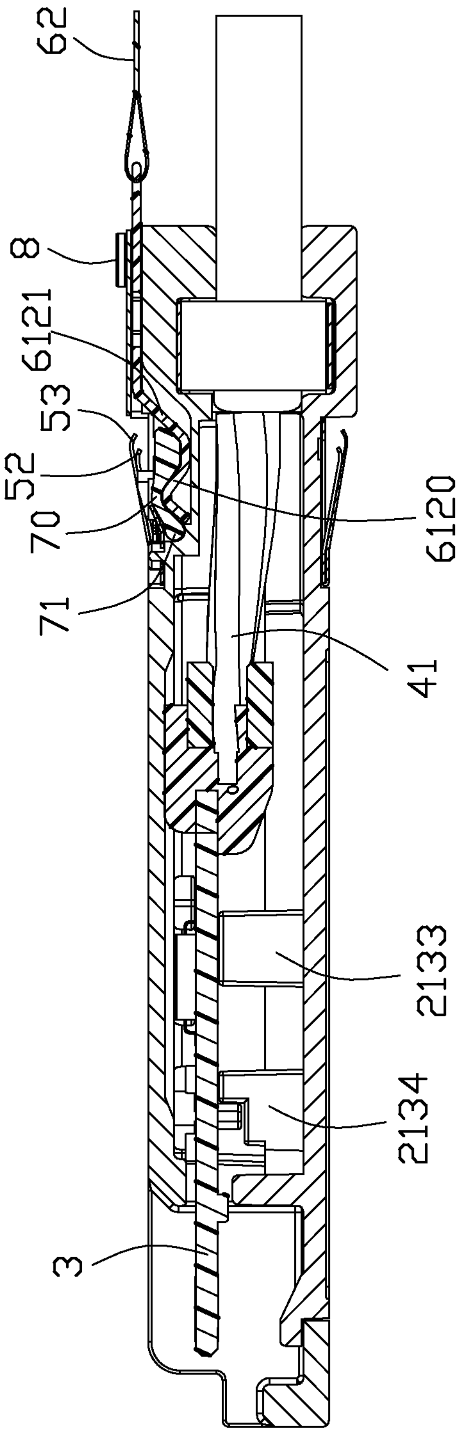
FIG. 7 is a cross-section view taken along line 7-7 of FIG. 4.
Figure 8:
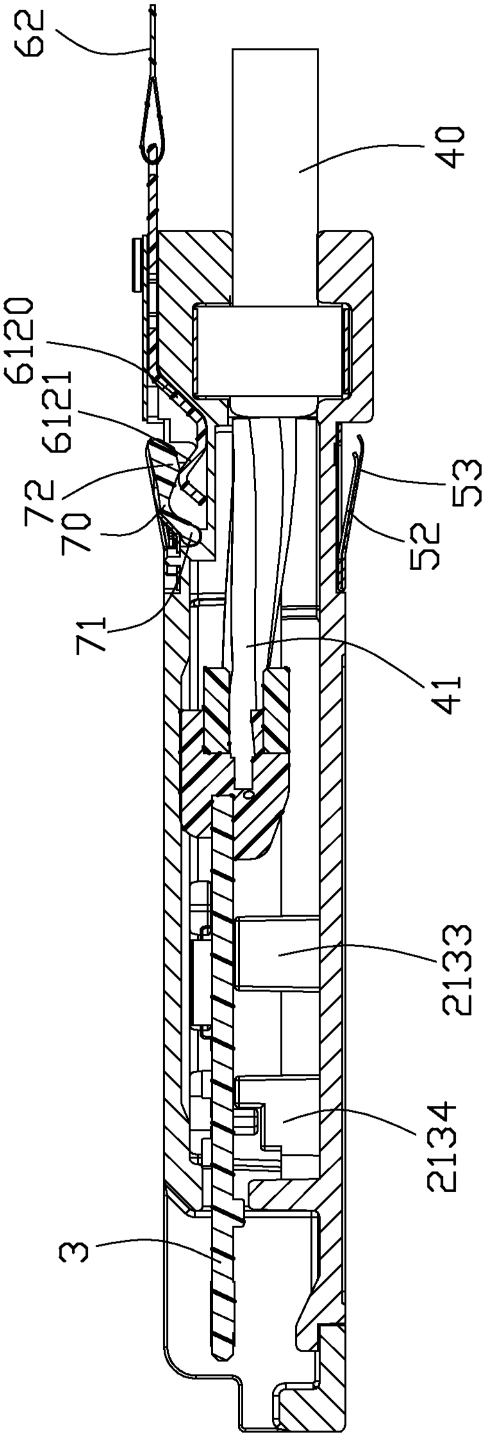
FIG. 8 is a cross-section view of FIG. 7 when a pull tape of the electronic module is moved rearwardly.

Referring to FIGS. 5-6, a complementary connector (not shown) mated with the electronic module 100 has a cage 200. The cage 200 is structured in a rectangular shape and has a receiving room formed therein for receiving a body portion of the electronic module 100. The cage 200 defines a first tab 201 having a through hole 202 formed on a front end thereof and a pair of second tabs 203 located at two sides of the first tab 201 for cooperating with two first fingers 53 of the gasket 5.

Figure 3:
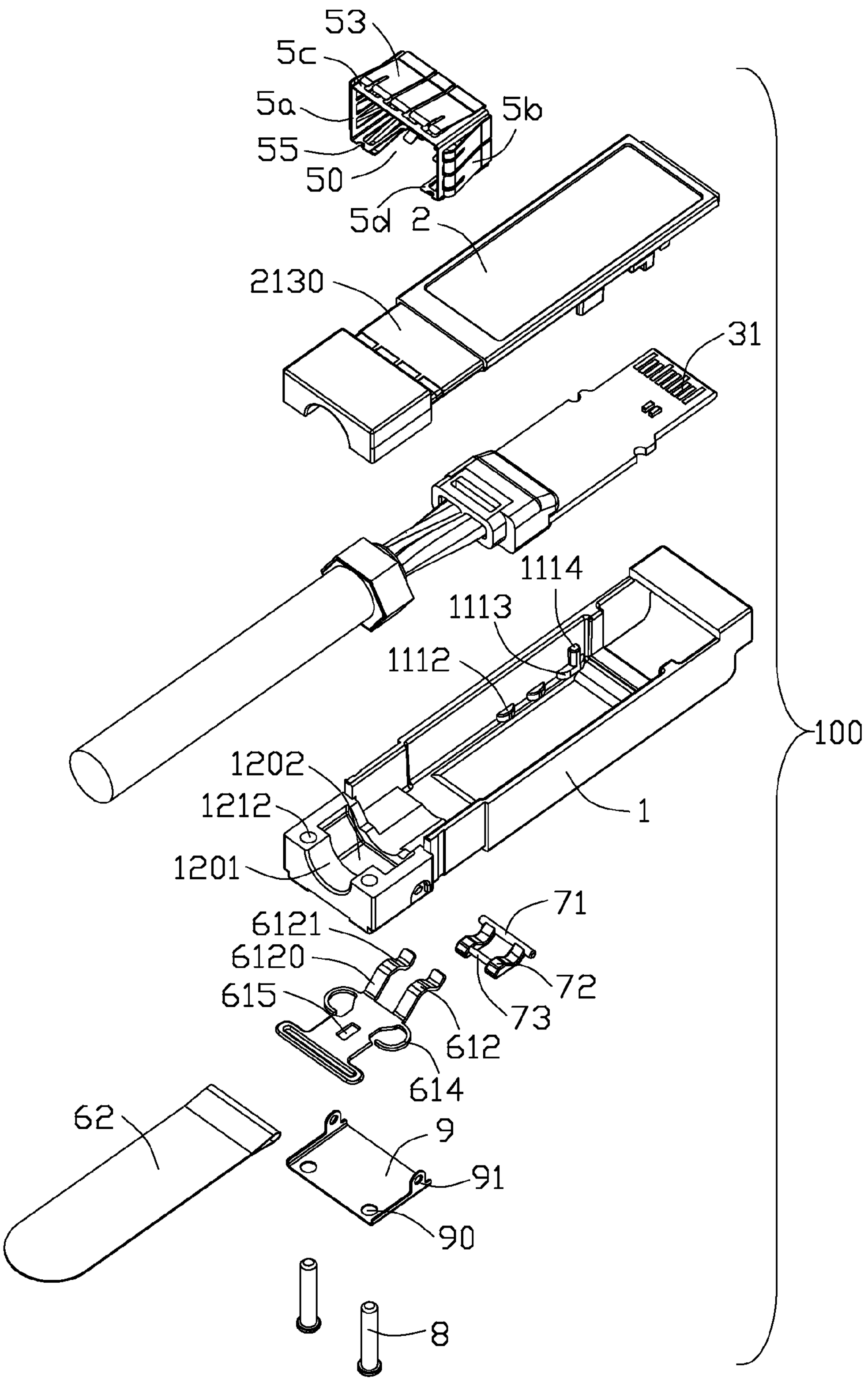
Figure 4:
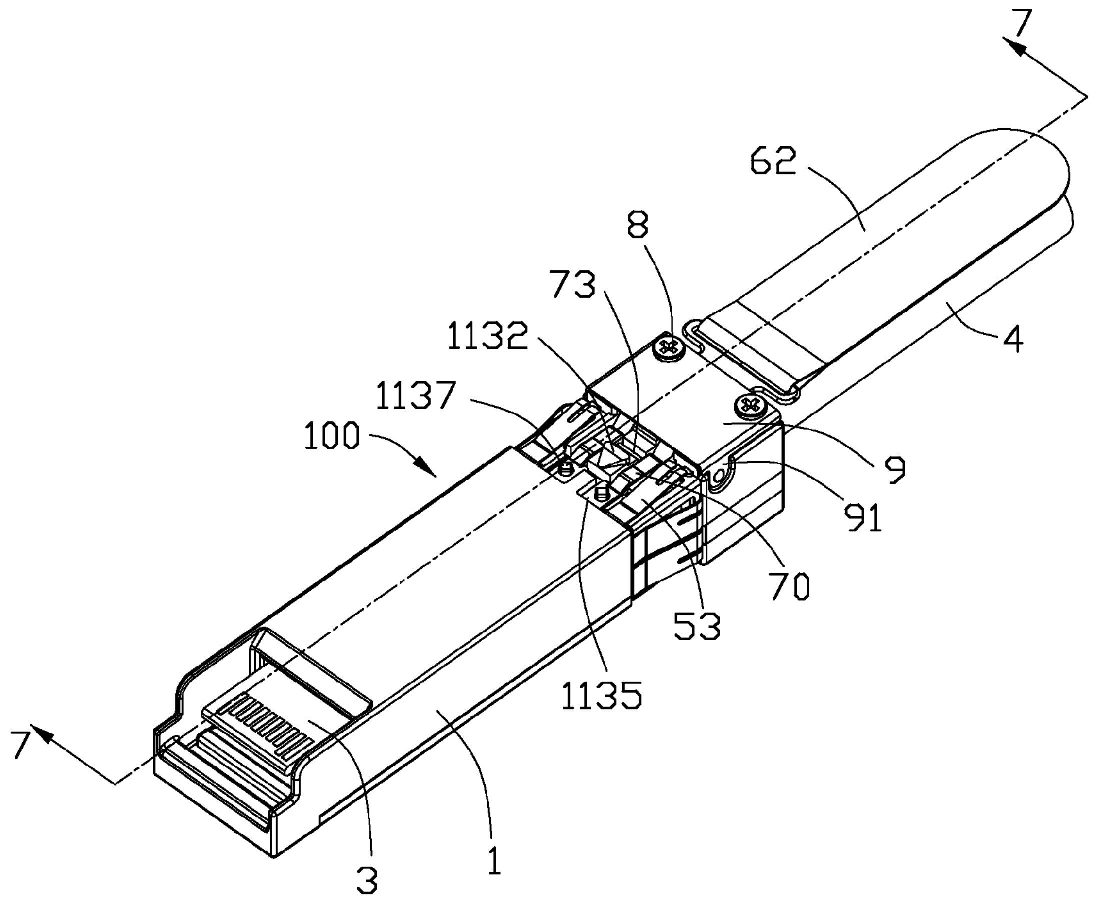
FIG. 4 is an assembled, perspective view of the electronic module shown in FIG. 1.

Referring to FIGS. 1-3, and in conjunction with FIGS. 4-8, in assembly, the insulative jacket 40 of a front segment of the cable 4 is decorticated. And, then the wires 41 are exposed outside and soldered to the second conductive pads of the printed circuit board 3. And the insulator 43 is formed around a connecting portion between the wires 41 and the printed circuit board 3.

The printed circuit board 3 is assembled into the base portion 1 and received in the receiving space 110 of the base portion 1. Simultaneously, the printed circuit board 3 is located on the first standoffs 1112 and the second standoffs 1113 of the base portion 1. And the situating posts 1114 are inserted into the positioning holes 32 of the printed circuit board 3 to position the printed circuit board 3 to the base portion 1.

The cable holder member 42 of the cable 4 is partially received into the first position slot 1202 of the base portion 1. The panel portion 2 is assembled to the base portion 1 with the pair of lateral flange members 211, 212 extending into the receiving space 110. The supporting posts 2133 attach to a bottom surface of the printed circuit board 3. The two situating posts 1114 are received into the first and second apertures 2134, 2135. As the first and second apertures 2134, 2135 have different opening facing directions. So the panel portion 2 is positioned with the base portion 1 along a front to rear direction. The protrusion portion 2132 of the panel portion 2 is received into the beam portion 114 of the base portion 1. The cable holder member 42 is totally received into the first and second position slots 1202, 2202.

The slider member 61 is assembled into the mounting channel 1221 of the first mounting portion 12. The projection 1222 of the base portion 1 is received in the groove 615 and confines a sliding movement of the slider member 61 relative to the base portion 1 along a mating direction. The elastic portions 614 are received in the two fixing passages 1223. The arm portions 612 are received in the pair of recesses 1138. The ejector 7 is disposed in the recesses 1138 and above the arm portions 612, with the tubers 72 abutting against the second slanted portions 6121. Apexes on the second slanted portions 6121 are located neighboring to the junction between the tubers 72 and the first bar 71. The first bar 71 is accommodated in the notch 1139, and the second bar 73 is received in the slit 1133.

The gasket 5 surrounds the rear out surface of the housing (not figured). The pair of vertical sides **5*a*, 5*b* are received into the pair of first depression portions 1110. The lower side 5*c* is received into the second depression portions 2130 of the panel portion 2. The engaging portions 54 are respectively received into the pair of indentations 1135. The tiny post 1137 formed in the indentation 1135 is passed through the circular hole 540. The tip ends 541 are adjacent to the corresponding cantilever portions 70 of the ejector 7 and neighboring to the first bar 71**.

The metallic member 9 is assembled to a top surface of the first mounting portion 12 and covered to the body portion 611 of the slider member 61. The connecting portions 91 are disposed in the semi-circular holes 1224 of the base portion 1. The opening 90, the screw hole 1212, the through hole 2211 are in alignment with each other along a vertical direction. A pair of fasteners or screws 8 are respectively passed through the opening 91, the screw hole 1212, the through hole 2211 to engage with the cover member 9, the base portion 1 and the panel portion 2 together.

When the electronic module 100 is received into the cage 200 of the complementary connector, the locking piece 1132 is passed through the through hole 202 of the first tab 201. An upper surface of the cantilever portions 70 are adjacent to the first tab 201 and on both sides of the through hole 202, the second tabs 203 are adjacent to the first fingers 53. Thus, the electronic module 100 is interlocked with the cage 200.

And, the arm portions 612 will move upwardly when the slider member 61 is exerted by a pulling force along a front to rear direction. And, the first tab 201 will be raised up by the cantilever portions 70 which is moved upwardly. At this time, the locking piece 1132 is disengaged with first tab 201. As a result, the electronic module 100 can be discreted from the cage 200. The elastic portions 614 will provide an elastic restoring force to promote the slider member 61 reset as the pull tape 62 is released.

It is to be understood, however, that even though numerous characteristics and advantages of the present invention have been set forth in the foregoing description, together with details of the structure and function of the invention, the disclosure is illustrated only, and changes may be made in detail, especially in matters of shape, size, and arrangement of parts within the principles of the invention to the full extent indicated by the broad general meaning of the terms in which the appended claims are expressed.

What is claimed is:

1. An electronic module for mating with a complementary connector, comprising:
   - a housing having a channel formed on an exterior surface thereof;
   - a printed circuit board disposed in the housing;
   - a slider member movably received in the channel, the slider member having a body portion and a pair of arm portions extending forwardly from the body portion;
   - a cover member confining the slider member to the housing;

a gasket mounted to the housing and having a pair of engaging portions; and an ejector located above the pair of arm portions of the slider member, the ejector having a pair of cantilever portions pivotable outward, in response to a sliding movement of the slider member, against the pair of engaging portions of the gasket.

2. The electronic module as claimed in claim 1, wherein each arm portion is curved and comprises a first slanted portion extending forwards from a front face of the body portion and a second slanted portion extending forwards from the first slanted portion.

3. The electronic module as claimed in claim 2, wherein each cantilever portion has a tuber protruding downwards from a back end thereof and abutting against a corresponding second slanted portion.

4. The electronic module as claimed in claim 3, wherein the ejector comprises a pivot connecting the pair of cantilever portions, apex of the second slanted portion being located neighboring to a junction between the tuber and the pivot.

5. The electronic module as claimed in claim 1, wherein the ejector comprises a pivot, and the housing comprises a notch receiving the pivot.

6. The electronic module as claimed in claim 5, wherein the ejector comprises a transverse bar parallel and opposite to the pivot.

7. The electronic module as claimed in claim 6, wherein the housing comprises a slit receiving the bar.

8. The electronic module as claimed in claim 7, wherein the housing comprises a locking piece situated between the notch and the slit.

9. The electronic module as claimed in claim 1, wherein the housing comprises a pair of passages on two lateral sides of the channel.

10. The electronic module as claimed in claim 9, wherein the slider member has a pair of elastic portions on both sides of the body portion, and the elastic portions are received in the passages.

11. The electronic module as claimed in claim 1, wherein the channel is defined in a rear section of the housing, and the channel extends along a front-to-back direction.

12. The electronic module as claimed in claim 1, wherein the gasket defines a plurality of first fingers located on an outer side thereof and a plurality of second fingers located on an inner side thereof.

13. An electrical module for latchable receipt within a cage having a deflectable locking tab thereof, comprising:

a housing defining a front mating port and a rear locking port along a front-to-back direction, the front mating port facing toward horizontally while the rear locking port facing vertically;

a locking piece formed on the locking port and projecting in a vertical direction perpendicular to said front-to-back direction for latchable receipt within a locking hole in the locking tab;

an ejector located around the locking port and defining at least one contacting portion located beside the locking piece and outwardly pivoted in the vertical direction for actuating the locking tab to be outwardly deflected to unlock the locking piece from the locking tab of the cage;

a slider member back and forth moveable in the front-to-back direction between inner relaxed and outer tensioned positions with an arm defining a projecting section in the vertical direction to abut against the contacting portion so as to force said contacting portion to be pivoted outwardly when the slider member is moved rearwardly.

14. The electrical module as claimed in claim 13, further including a gasket equipped with a plurality of spring fingers and located upon the housing around the locking piece for abutment with the cage during mating, wherein said gasket defines an engaging portion constantly contacting the ejector to urge the ejector to move back toward an inner position after the ejector is actuated by the slider member to move from the inner position to an outer position for unlocking.

15. The electrical module as claimed in claim 14, wherein the ejector is pivoted about a pivot which is essentially located at a front end of the ejector.

16. The electrical module as claimed in claim 13, wherein the contacting portion defines a slanted portion against which the projecting section abuts.

17. An electrical module assembly comprising:

a cage defining a receiving space with a front opening in communication with an exterior, and a cantilevered deflectable locking tab around the front opening;

an electrical module including:

a housing adapted to be received in the receiving space of the cage and defining a front mating port and a rear locking port along a front-to-back direction, the front mating port facing horizontally while the rear locking port facing vertically;

a locking piece formed on the locking port and projecting in a vertical direction perpendicular to said front-to-back direction for latchable receipt within a locking hole in the locking tab;

an ejector located around the locking piece and defining a contacting portion with an outer free end moveable relative to the housing in both the front-to-back direction and a vertical direction perpendicular to said front-to-back direction; and a slider member back and forth moveable in the front-to-back direction between inner relaxed and outer tensioned positions, and essentially sandwiched between the ejector and the housing with an arm defining around the locking piece a projecting section, in the vertical direction, to abut against the contacting portion; wherein when the cage and the electrical module are mated with each other under condition that the locking piece of the electrical module is received in the locking hole of the locking tab of the cage, upon rearwardly moving the slider member in the front-to-back direction and via abutment between the projecting section and the contacting portion, the locking tab is forcibly outwardly deflected to release the locking piece from the locking hole so as to allow the electrical module to be withdrawn from the cage.

18. The electrical module assembly as claimed in claim 17, wherein ejector defines an inner fixed end opposite to the outer free end, said inner fixed end being located in front of the outer free end.

19. The electrical module assembly as claimed in claim 18, wherein said fixed end is essentially a pivot end.

20. The electrical module assembly as claimed in claim 17, further including a gasket enclosing the housing around the locking piece wherein said ejector is discrete from while contacting with the gasket.

* * * * *